United States Patent
Saito et al.

(10) Patent No.: US 8,283,720 B2
(45) Date of Patent: Oct. 9, 2012

(54) POWER SEMICONDUCTOR DEVICE

(75) Inventors: Wataru Saito, Kanagawa-ken (JP);
Syotaro Ono, Kanagawa-ken (JP);
Masakatsu Takashita, Kanagawa-ken (JP); Yauto Sumi, Hyogo-ken (JP);
Masaru Izumisawa, Hyogo-ken (JP);
Wataru Sekine, Hyogo-ken (JP);
Hiroshi Ohta, Tokyo (JP); Shoichiro Kurushima, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 353 days.

(21) Appl. No.: 12/050,415

(22) Filed: Mar. 18, 2008

(65) Prior Publication Data

US 2008/0246079 A1    Oct. 9, 2008

(30) Foreign Application Priority Data

Apr. 5, 2007    (JP) .................... 2007-099715

(51) Int. Cl.
*H01L 29/00* (2006.01)
*H01L 29/66* (2006.01)

(52) U.S. Cl. ........ 257/328; 257/327; 257/335; 257/341; 257/342; 257/E29.001

(58) Field of Classification Search .............. 257/335, 257/342, 341, 327, E29.256, E29.001, 328
See application file for complete search history.

(56) References Cited

U.S. PATENT DOCUMENTS

| | | | |
|---|---|---|---|
| 6,693,338 B2 * | 2/2004 | Saitoh et al. | 257/492 |
| 6,888,195 B2 | 5/2005 | Saito et al. | |
| 7,276,773 B2 | 10/2007 | Saito et al. | |
| 7,301,202 B2 | 11/2007 | Kouzuki et al. | |
| 2006/0043481 A1 | 3/2006 | Yamashita et al. | |
| 2006/0131644 A1* | 6/2006 | Saito et al. | 257/329 |
| 2006/0194391 A1 | 8/2006 | Saggio et al. | |
| 2007/0114602 A1 | 5/2007 | Saito et al. | |

FOREIGN PATENT DOCUMENTS

| | | |
|---|---|---|
| JP | 2004-119611 | 4/2004 |
| JP | 2006-179598 | 7/2006 |
| JP | 2008-159601 | 7/2008 |

* cited by examiner

*Primary Examiner* — Samuel Gebremariam
*Assistant Examiner* — Naima Kearney
(74) *Attorney, Agent, or Firm* — Oblon, Spivak, McClelland, Maier & Neustadt, L.L.P.

(57) ABSTRACT

A power semiconductor device includes: a first semiconductor layer; a second semiconductor layer and a third semiconductor layer provided in an upper portion of the first semiconductor layer and alternately arranged parallel to an upper surface of the first semiconductor layer; a plurality of fourth semiconductor layers provided on the third semiconductor layer; a fifth semiconductor layer selectively formed in an upper surface of each of the fourth semiconductor layers; a control electrode; a gate insulating film; a first main electrode provided on a lower surface of the first semiconductor layer; and a second main electrode provided on the fourth and the fifth semiconductor layers. Sum of the amount of impurities in the second semiconductor layer and the amount of impurities in the third semiconductor layer at an end on the second main electrode side of the second semiconductor layer and the third semiconductor layer is smaller than the sum at a center of the second semiconductor layer and the third semiconductor layer in the direction from the first main electrode to the second main electrode.

20 Claims, 13 Drawing Sheets

POWER SEMICONDUCTOR DEVICE

CROSS-REFERENCE TO RELATED APPLICATIONS

This application is based upon and claims the benefit of priority from the prior Japanese Patent Application No. 2007-099715, filed on Apr. 5, 2007; the entire contents of which are incorporated herein by reference.

BACKGROUND OF THE INVENTION

1. Field of the Invention

This invention relates to a power semiconductor device, and more particularly to a power semiconductor device having a super junction structure.

2. Background Art

The on-resistance of a vertical power MOSFET (metal oxide semiconductor field effect transistor) greatly depends on the electric resistance of its conduction layer (drift layer). The dopant concentration that determines the electric resistance of the drift layer cannot exceed a maximum limit, which depends on the breakdown voltage of a pn junction interface between the base layer and the drift layer. Thus there is a tradeoff between the device breakdown voltage and the on-resistance. Improving this tradeoff is important in reducing the power consumption of a power device. This tradeoff has a limit determined by the device material. Overcoming this limit is the way to realizing devices with low on-resistance beyond existing power semiconductor devices.

As an example MOSFET to solve this problem, a structure with p-pillar layers and n-pillar layers alternately buried in the drift layer is known as a super junction structure. In the super junction structure, a non-doped layer is artificially produced by equalizing the amount of charge (amount of impurities) contained in the p-pillar layer with that contained in the n-pillar layer. Thus, while holding a high breakdown voltage, a current is passed through the highly doped n-pillar layer. Hence a low on-resistance beyond the material limit can be realized.

Thus the super junction structure can be used to achieve a balance between on-resistance and breakdown voltage beyond the material limit. However, if the amount of impurities in the p-pillar layer and that in the n-pillar layer become unequal to each other for some reason, the electric field distribution is varied by the charge due to the difference in the amount of impurities, decreasing the breakdown voltage. Hence, in manufacturing such a device, process variation needs to be taken into consideration in designing the device structure.

As a structure for preventing the decrease of breakdown voltage due to process variation, the inventors have developed and proposed a structure in which the impurity concentration profile of the p-pillar layer and the impurity concentration profile of the n-pillar layer are made different from each other (see JP-A 2004-119611 (Kokai)). In this structure, the balance between the amount of impurities in the p-pillar layer and the amount of impurities in the n-pillar layer is locally broken in advance. Thus, even if the amount of impurities in each pillar varies, the resulting variation of the electric field distribution is small, and the decrease of breakdown voltage can be prevented.

However, in this structure, the balance of the amount of impurities is forcibly broken. Hence it is necessary to increase the effective amount of impurities in the pillar layer. Thus the decrease of electric field due to the difference in the amount of impurities is canceled out by the increase of electric field due to the increase in the amount of impurities, decreasing the effect of varying the electric field distribution. Hence, for a sufficient variation of the electric field distribution, the difference in the amount of impurities needs to be further increased. Consequently, the amount of impurities in the p-pillar layer increases, and hence the n-pillar layer for passing the current tends to be depleted, increasing the on-resistance.

SUMMARY OF THE INVENTION

According to an aspect of the invention, there is provided a power semiconductor device including: a first semiconductor layer of a first conductivity type; a second semiconductor layer of the first conductivity type and a third semiconductor layer of a second conductivity type provided in an upper portion of the first semiconductor layer and alternately arranged parallel to an upper surface of the first semiconductor layer; a plurality of fourth semiconductor layers of the second conductivity type provided on the third semiconductor layer and connected to the third semiconductor layer; a fifth semiconductor layer of the first conductivity type selectively formed in an upper surface of each of the fourth semiconductor layers; a control electrode provided in a region including a directly overlying region of a portion of the fourth semiconductor layer located between the second semiconductor layer and the fifth semiconductor layer; a gate insulating film insulating the control electrode from the second semiconductor layer, the fourth semiconductor layer, and the fifth semiconductor layer; a first main electrode provided on a lower surface of the first semiconductor layer and electrically connected to the first semiconductor layer; and a second main electrode provided on the fourth semiconductor layer and the fifth semiconductor layer and connected to the fourth semiconductor layer and the fifth semiconductor layer, sum of the amount of impurities in the second semiconductor layer and the amount of impurities in the third semiconductor layer at an end on the second main electrode side of the second semiconductor layer and the third semiconductor layer being smaller than the sum at a center of the second semiconductor layer and the third semiconductor layer in the direction from the first main electrode to the second main electrode.

DETAILED DESCRIPTION OF THE INVENTION

Figure 1:
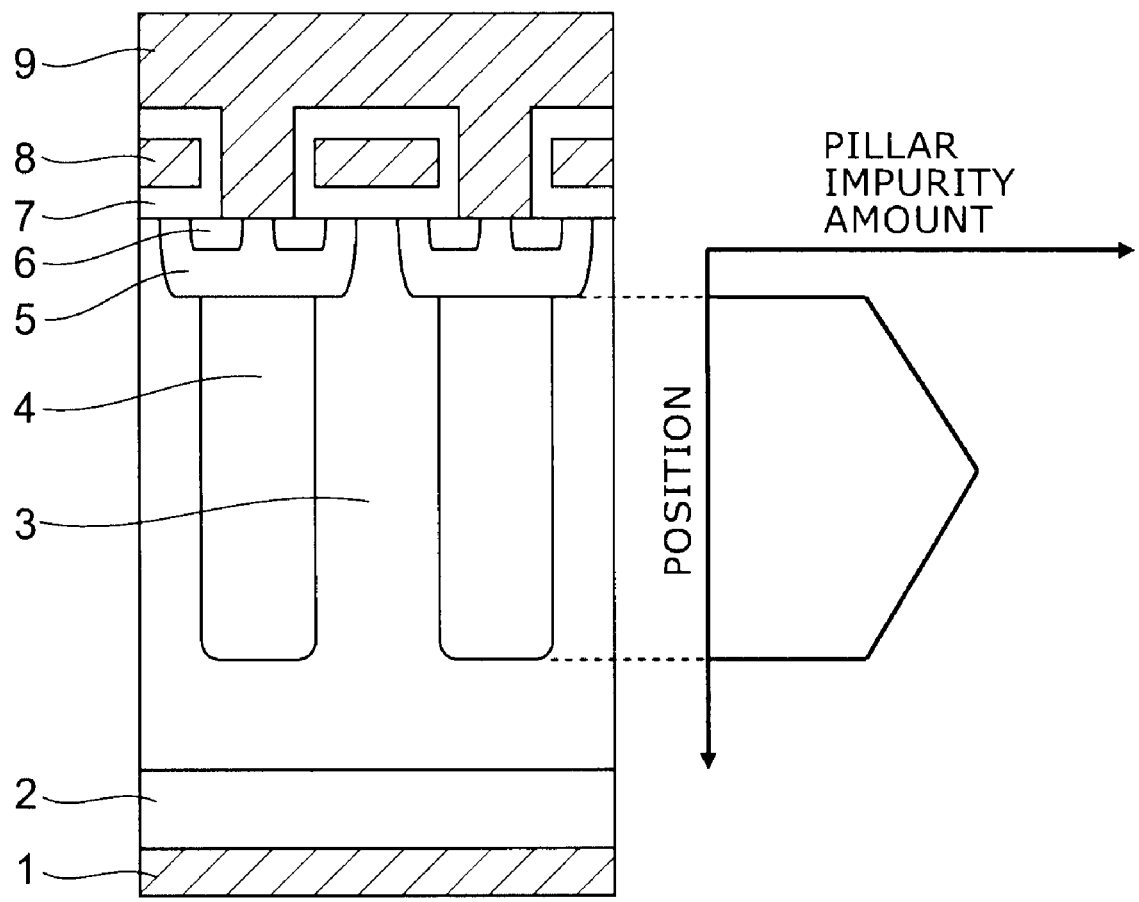
FIG. 1 shows a cross-sectional view schematically illustrating the configuration of a power MOSFET according to a first embodiment of the invention, and a graph illustrating the profile of the amount of impurities in the pillar layer, where the vertical axis represents the vertical position in the pillar layer, and the horizontal axis represents the pillar impurity amount.

Embodiments of the invention will now be described with reference to the drawings. In the following embodiments, it is assumed that the first conductivity type and the second conductivity type are n-type and p-type, respectively. Like elements in the drawings are marked with like reference numerals.

First Embodiment

FIG. 1 shows a cross-sectional view schematically illustrating the configuration of a power MOSFET, which is a power semiconductor device according to a first embodiment of the invention, and a graph illustrating the profile of the amount of impurities in the pillar layer, where the vertical axis represents the vertical position in the pillar layer, and the horizontal axis represents the amount of impurities in the pillar layer (hereinafter also referred to as "pillar impurity amount"). The vertical axis of the graph shown in FIG. 1 corresponds to the position in the cross-sectional view. This also applies to the other figures described below.

As shown in FIG. 1, the MOSFET according to this embodiment includes an $n^+$-drain layer 2 with the n-type conductivity serving as a first semiconductor layer. On the $n^+$-drain layer 2 are provided n-pillar layers 3 serving as second semiconductor layers and p-pillar layers 4 serving as third semiconductor layers, which constitute a superjunction structure (hereinafter also referred to as "SJ structure"). The conductivity type of the n-pillar layer 3 and the p-pillar layer 4 is n-type and p-type, respectively. The number of the n-pillar layers 3 and the p-pillar layers 4 is more than one, respectively, and they are alternately and periodically arranged along the direction parallel to the upper surface of the $n^+$-drain layer 2. In an example, the n-pillar layer 3 and the p-pillar layer 4 are formed like a stripe and extend linearly along the direction perpendicular to the page of FIG. 1. The p-pillar layer 4 may or may not be in contact with the $n^+$-drain layer 2. In the example shown in FIG. 1, the p-pillar layer 4 is not in contact with the $n^+$-drain layer 2, and between these layers is interposed an n-type layer integrally formed with the n-pillar layer 3.

A p-type p-base layer 5 is provided as a fourth semiconductor layer on each p-pillar layer 4 and is connected thereto. That is, a plurality of p-base layers 5 are provided, and the upper end of the n-pillar layer 3 is interposed between adjacent p-base layers 5. Two n-type n-source layers 6 are selectively formed as fifth semiconductor layers in the upper surface of each p-base layer 5 and are spaced from each other in the arranging direction of the n-pillar layers 3 and the p-pillar layers 4 (hereinafter also referred to as "horizontal" direction).

A gate electrode 8 is provided as a control electrode directly above the region between adjacent n-source layers 6 formed in adjacent p-base layers 5. That is, the gate electrode 8 is provided directly above one of the p-base layers 5 disposed between adjacent n-source layers 6, the n-pillar layer 3, and the other p-base layer 5, and hence is provided in a region including the directly overlying region of the portion of the p-base layer 5 located between the n-pillar layer 3 and the n-source layer 6. The upper surfaces of the n-pillar layer 3, the p-base layer 5, and the n-source layer 6 constitute a coplanar surface, and a gate insulating film 7 is provided on this surface. The gate insulating film 7 insulates the gate electrode 8 from the n-pillar layer 3, the p-base layer 5, and the n-source layer 6.

Furthermore, a drain electrode 1 is provided as a first main electrode on the lower surface of the $n^+$-drain layer 2 and electrically connected thereto. On the other hand, a source electrode 9 is provided above the n-pillar layer 3, the p-pillar layer 4, the p-base layer 5, and the n-source layer 6, and electrically connected to the p-base layer 5 and the n-source layer 6. The source electrode 9 is provided also above the gate electrode 8, but is insulated therefrom.

In an example, the n$^+$-drain layer 2, the n-pillar layer 3, the p-pillar layer 4, the p-base layer 5, and the n-source layer 6 are formed from single crystal silicon (Si). The gate insulating film 7 is formed from silicon oxide (SiO$_2$). The gate electrode 8 is formed from polycrystalline silicon. The drain electrode 1 and the source electrode 9 are formed from metal.

The sum of the amount of impurities in the n-pillar layer 3 and the amount of impurities in the p-pillar layer 4 varies in the direction from the source electrode 9 to the drain electrode 1 (hereinafter also referred to as "vertical" direction), maximized at the vertical center of the n-pillar layer 3 and the p-pillar layer 4 (hereinafter collectively referred to as "pillar layer"), decreasing toward the upper end and the lower end, and minimized at the upper end and the lower end. That is, the sum of the amount of impurities in the n-pillar layer 3 and the amount of impurities in the p-pillar layer 4 at the end on the source electrode 9 side of the n-pillar layer 3 and the p-pillar layer 4 is smaller than the sum at the vertical center of the n-pillar layer 3 and the p-pillar layer 4. It is noted that the term "amount of impurities" used herein refers to the product of the impurity concentration (cm$^{-3}$) and the horizontal width (cm) of each pillar layer, representing the amount of impurities existing at a given vertical position. In this embodiment, the amount of impurities in the n-pillar layer 3 and that in the p-pillar layer 4 are equal and have the same distribution.

Next, the operation and effect of this embodiment are described.

In this embodiment, the amount of impurities in the pillar layer has a profile shown in FIG. 1. Hence the electric field also has a distribution similar to this profile, that is, a distribution being high at the vertical center and low at the upper and lower end. The electric field in the super junction structure is the sum of the horizontal electric field for depleting the super junction structure during voltage application and the vertical electric field applied after complete depletion. Hence decreasing the amount of impurities at the upper and lower end facilitates depletion, and the electric field at the upper and lower end can be decreased.

Decreasing the electric field at the upper and lower end of the pillar layer results in a decreased electric field at the interface between the p-base layer 5 and the n-pillar layer 3, where avalanche breakdown is most likely to occur, and the breakdown voltage of the entire device can be stabilized. Furthermore, by decreasing in advance the electric field at the upper and lower end of the super junction structure relative to that at the center, it is possible to prevent the variation of the electric field distribution due to variation in the amount of impurities, and to prevent the decrease of breakdown voltage, even if the amount of impurities in the n-pillar layer 3 and that in the p-pillar layer 4 become unequal due to process variation in device fabrication. Moreover, by decreasing the electric field at the upper and lower end of the SJ structure, negative resistance is difficult to occur even if a large amount of carriers are generated by avalanche breakdown, and thus a large avalanche withstand capability can be obtained.

It is noted that decreasing the electric field at the upper and lower end of the super junction structure relative to that at the center results in decreasing the ideal breakdown voltage, that is, the breakdown voltage obtained when the amount of impurities in the n-pillar layer 3 and that in the p-pillar layer 4 are completely equal to each other. However, according to this embodiment, a stable breakdown voltage can be obtained despite variation in the amount of impurities (charge imbalance). Hence, upon consideration of process variation, it is possible to realize a power MOSFET having a high breakdown voltage as a commercially-available product.

Comparative Examples

Next, comparative examples of this embodiment are described.

Figure 2:
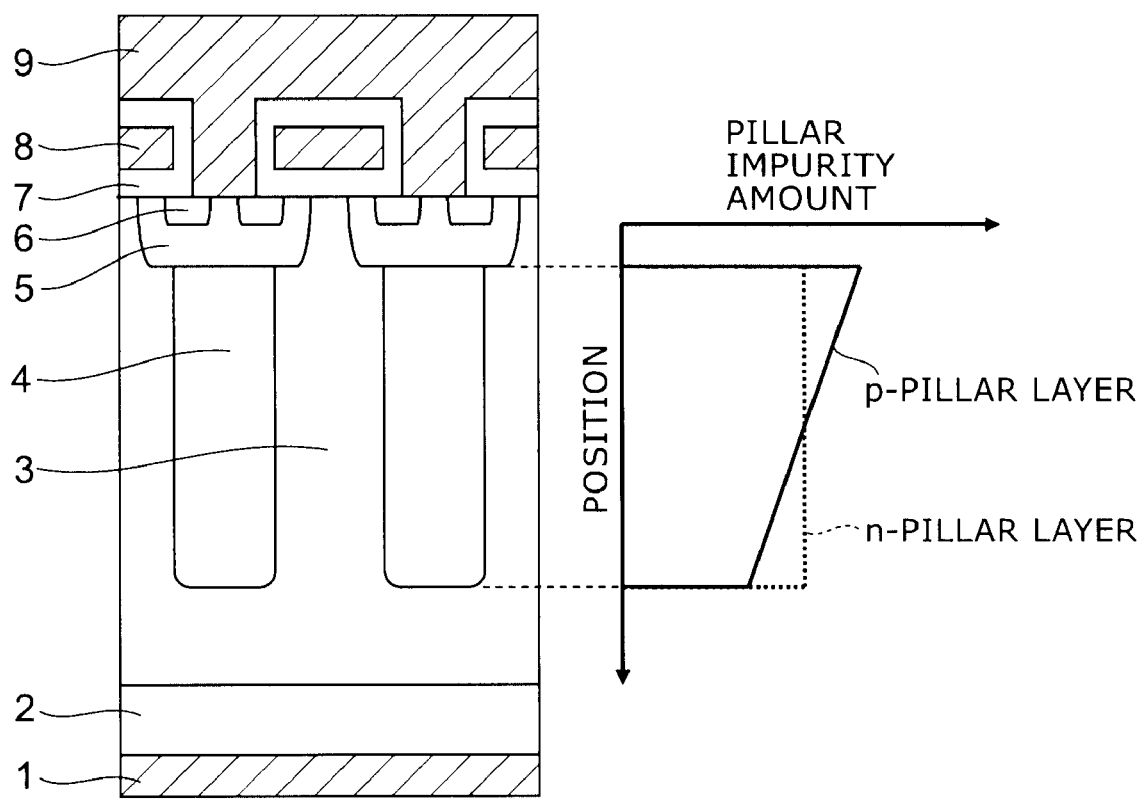
FIG. 2 shows a cross-sectional view schematically illustrating a power MOSFET according to a first comparative example, and a graph illustrating the profile of the amount of impurities in the pillar layer, where the vertical axis represents the vertical position in the pillar layer, and the horizontal axis represents the pillar impurity amount.

FIG. 2 shows a cross-sectional view schematically illustrating a power MOSFET according to a first comparative example, and a graph illustrating the profile of the amount of impurities in the pillar layer, where the vertical axis represents the vertical position in the pillar layer, and the horizontal axis represents the pillar impurity amount.

Figure 3:
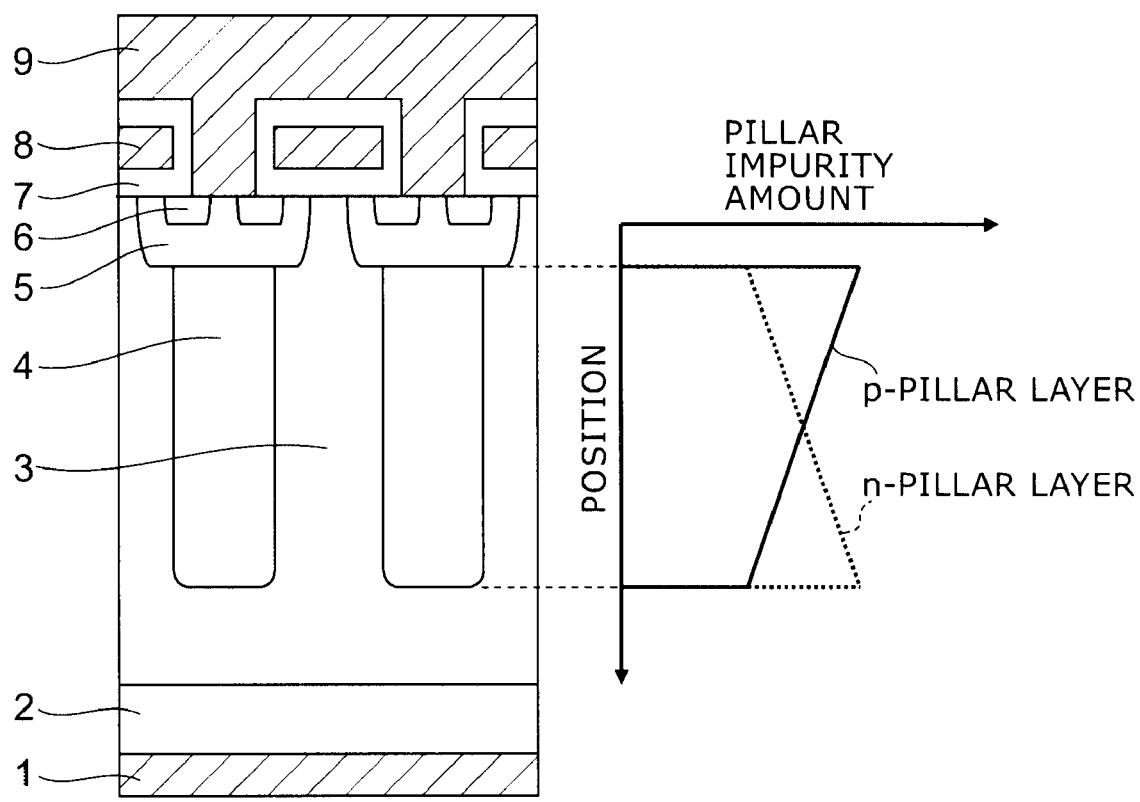
FIG. 3 shows a cross-sectional view schematically illustrating a power MOSFET according to a second comparative example, and a graph illustrating the profile of the amount of impurities in the pillar layer, where the vertical axis represents the vertical position in the pillar layer, and the horizontal axis represents the pillar impurity amount.

FIG. 3 shows a cross-sectional view schematically illustrating a power MOSFET according to a second comparative example, and a graph illustrating the profile of the amount of impurities in the pillar layer, where the vertical axis represents the vertical position in the pillar layer, and the horizontal axis represents the pillar impurity amount.

As described above, to obtain a stable breakdown voltage in a device having a SJ structure, it is effective to realize an electric field distribution where the electric field decreases at the upper and lower end of the SJ structure. To this end, in the comparative examples shown in FIGS. 2 and 3, the impurity amount profile of the n-pillar layer 3 and the impurity amount profile of the p-pillar layer 4 are varied independently so that the amount of impurities in the p-pillar layer 4 is larger on the source side whereas the amount of impurities in the n-pillar layer 3 is larger on the drain side. This produces charge due to the difference between the amount of n-type impurities and the amount of p-type impurities, and a vertical electric field is produced by this charge, forming an electric field distribution being high at the vertical center and low at the upper and lower end in the SJ structure.

However, to produce a large variation in the electric field distribution by this method, the difference in the amount of impurities needs to be increased. In the structure shown in FIG. 2, to produce a large difference in the amount of impurities, the impurity concentration in the p-pillar layer 4 needs to be increased at the upper end of the SJ structure. However, like the case of increasing the average of the pillar impurity amount, the increased impurity concentration in the p-pillar layer 4 interferes with depletion of the p-pillar layer 4, increasing the horizontal electric field. Thus the effect of decreasing the electric field by the difference in the amount of impurities is weakened. Hence the difference in the amount of impurities needs to be further increased. Then, if the concentration in the p-pillar layer 4 is further increased, the depletion layer tends to extend into the n-pillar layer 3 side where the current flows, increasing the on-resistance.

On the other hand, as shown in FIG. 3, in the case where the impurity amount profile of the n-pillar layer 3 and the impurity amount profile of the p-pillar layer 4 are oppositely sloped, the horizontal electric field is small because the average pillar impurity amount is equal at any positions in the vertical direction. However, as the difference in the amount of impurities increases, the amount of impurities in the n-pillar layer 3 more significantly decreases at the upper end of the SJ structure, increasing the on-resistance. Thus, any attempts to obtain a large variation in the electric field distribution in the structures shown in FIGS. 2 and 3 entails an increased on-resistance.

In contrast, in the first embodiment of the invention, the horizontal electric field is directly reduced by decreasing the amount of impurities at the upper and lower end of the pillar layer, and hence nothing negates this effect. Therefore, even if the variation in the amount of impurities is smaller than that in the structure of the comparative examples, an effect equivalent to that in the comparative examples can be achieved. Thus, even in a similar electric field distribution, the increase of on-resistance is smaller than that in the comparative examples. Consequently, in the structure of the first embodiment, the increase of on-resistance is smaller than that in the comparative examples. That is, according to the first embodiment, the pillar impurity amount is decreased at the upper and lower end of the pillar layer to facilitate depletion in the SJ structure, decreasing the electric field. This results in an effect similar to that in the case of locally breaking the balance of the pillar impurity amount. Furthermore, a low on-resistance can be realized because the difference in the pillar impurity amount can be kept small.

For example, relative to the amount of impurities at the vertical center of the pillar layer, the amount of impurities at the upper end of the p-pillar layer 4 needs to be decreased to approximately 50% in the structure according to the comparative examples. In contrast, in the structure according to the first embodiment, the decreased amount of impurities at the upper end of the p-pillar layer 4 can be held down to approximately 20%. Consequently, the increase of on-resistance is approximately 20% in the comparative examples, whereas it is held down to approximately 10% in the first embodiment.

Here, also in the comparative examples, the amount of impurities is varied vertically, and the sum of the amount of impurities in the n-pillar layer 3 and the amount of impurities in the p-pillar layer 4 also varies. However, the sum of the amounts of impurities increases on the source electrode 9 side as shown in FIG. 2, or is vertically constant as shown in FIG. 3. Hence it is different from the structure of the first embodiment where the sum of the amounts of impurities at the end on the source electrode 9 side is smaller than the sum at the vertical center.

First Modification of the First Embodiment

Figure 4:
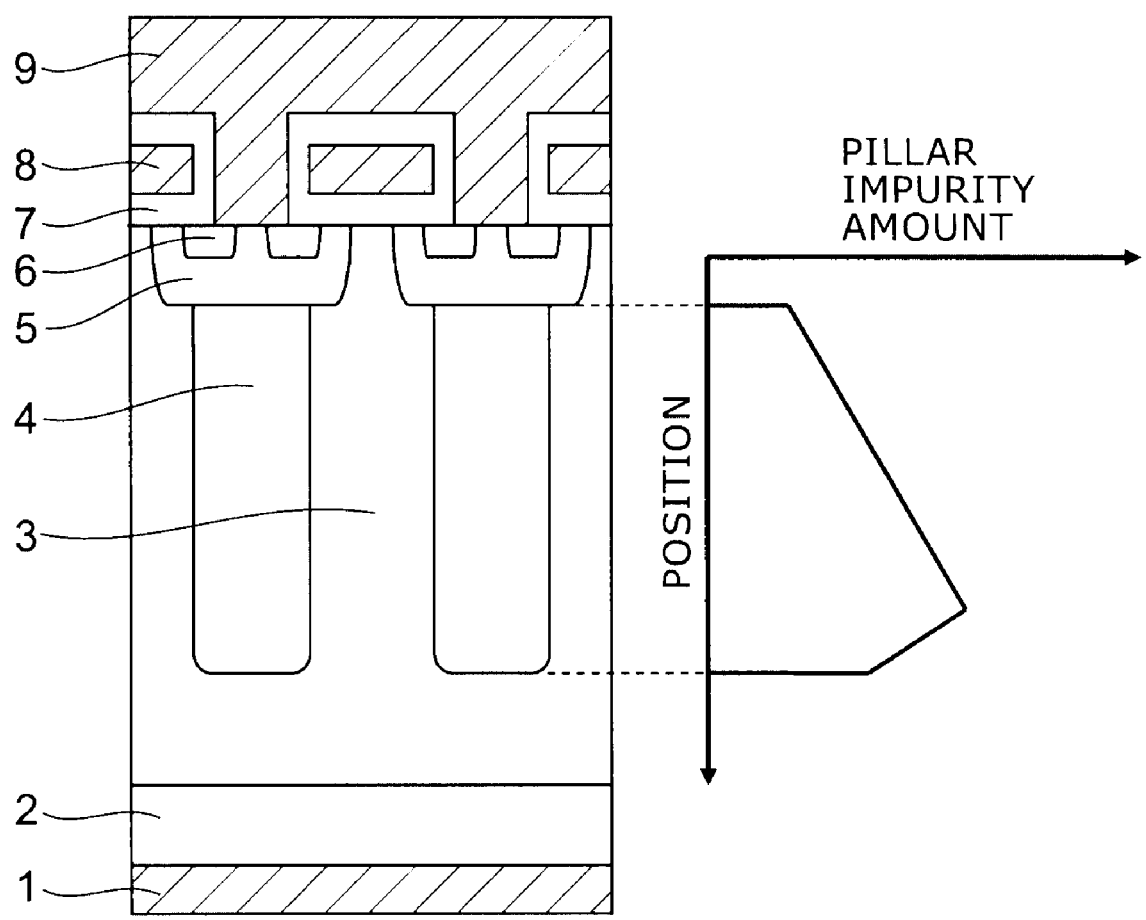
FIG. 4 shows a cross-sectional view schematically illustrating a power MOSFET according to a first modification of the first embodiment, and a graph illustrating the profile of the amount of impurities in the pillar layer, where the vertical axis represents the vertical position in the pillar layer, and the horizontal axis represents the pillar impurity amount.

FIG. 4 shows a cross-sectional view schematically illustrating a power MOSFET according to a first modification of the first embodiment, and a graph illustrating the profile of the sum of amount of impurities in the pillar layer, where the vertical axis represents the vertical position in the pillar layer, and the horizontal axis represents the pillar impurity amount.

As shown in FIG. 4, in this modification, the sum of the impurity amount profile of the pillar layer is not vertically symmetric, but the sum at the upper end is smaller than the sum at the lower end, and the maximal peak of the sum of the amount of impurities is located below the vertical center, that is, on the drain electrode 1 side. Such a structure can be fabricated by varying the dose amount or the mask opening width for ion implantation in the process of repeating ion implantation and buried growth or the process of performing ion implantation a plurality of times with varied acceleration voltages.

As described in the first embodiment, by decreasing the electric field at the upper and lower end of the SJ structure, negative resistance is difficult to occur even if a large amount of carriers are generated by avalanche breakdown, and thus a high avalanche withstand capability can be obtained. Upon avalanche breakdown, carriers tend to be accumulated on the source electrode side, and hence the electric field is preferably smaller on the source side than on the drain side. In this modification, the impurity amount profile of the pillar layer is vertically asymmetric as shown in FIG. 4. Thus the electric field at the source-side end of the SJ structure can be made smaller, and a higher avalanche withstand capability can be achieved. The configuration, operation, and effect of this modification other than the foregoing are the same as those of the above first embodiment.

Second Modification of the First Embodiment

Figure 5:
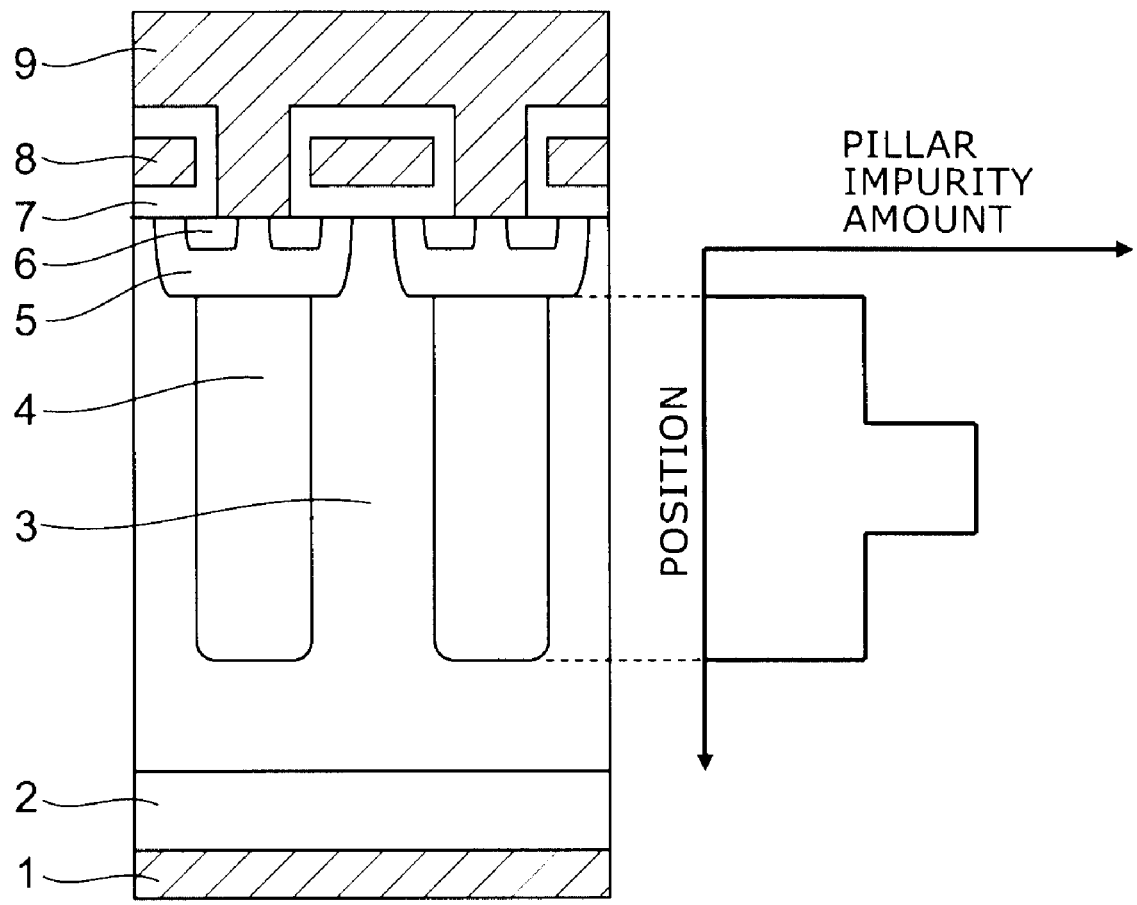
FIG. 5 shows a cross-sectional view schematically illustrating a power MOSFET according to a second modification of the first embodiment, and a graph illustrating the profile of the amount of impurities in the pillar layer, where the vertical axis represents the vertical position in the pillar layer, and the horizontal axis represents the pillar impurity amount.

FIG. 5 shows a cross-sectional view schematically illustrating a power MOSFET according to a second modification of the first embodiment, and a graph illustrating the profile of the amount of impurities in the pillar layer, where the vertical axis represents the vertical position in the pillar layer, and the horizontal axis represents the pillar impurity amount.

As shown in FIG. 5, in this modification, the amount of impurities in the pillar layer discontinuously varies along the vertical direction. Such a profile can be implemented by discontinuously varying the impurity concentration during epitaxial growth. Such a structure can also achieve an effect similar to that of the above first embodiment.

Third Modification of the First Embodiment

Figure 6:
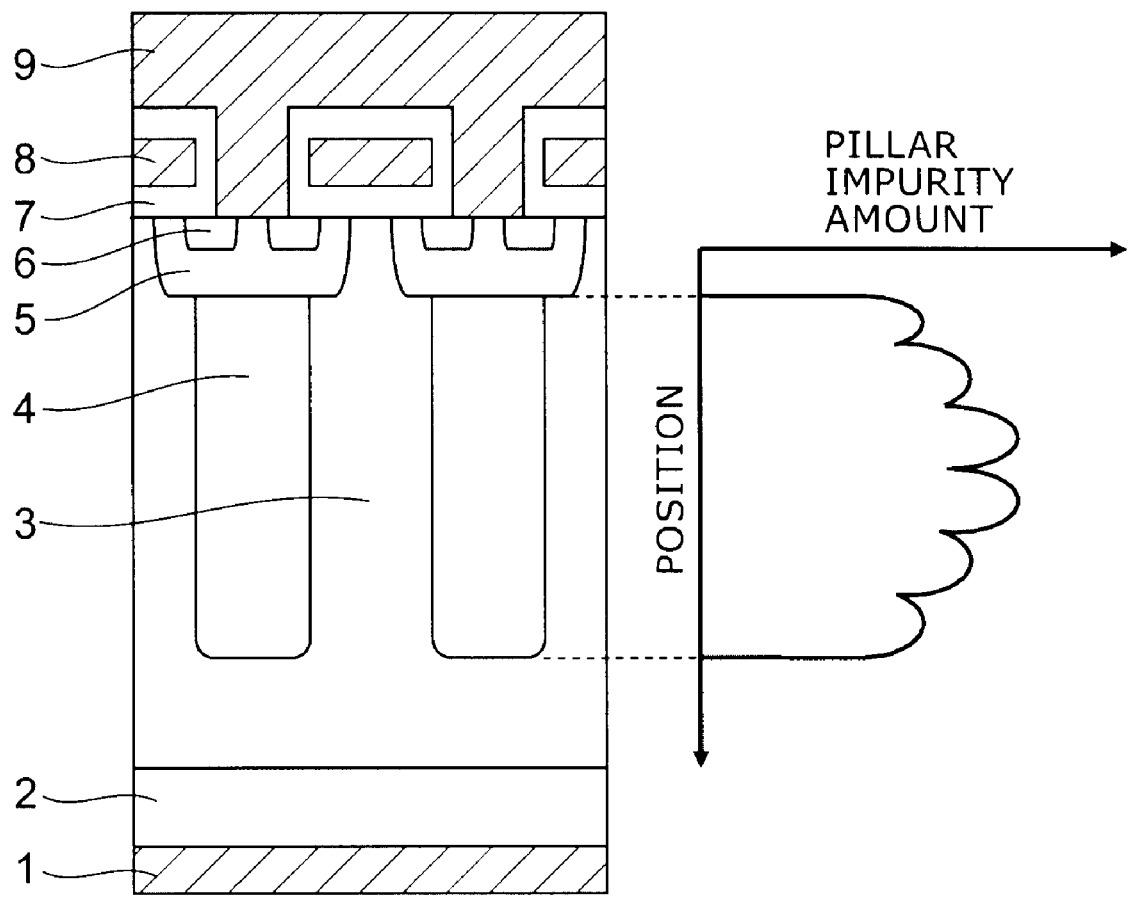
FIG. 6 shows a cross-sectional view schematically illustrating a power MOSFET according to a third modification of the first embodiment, and a graph illustrating the profile of the amount of impurities in the pillar layer, where the vertical axis represents the vertical position in the pillar layer, and the horizontal axis represents the pillar impurity amount.

FIG. 6 shows a cross-sectional view schematically illustrating a power MOSFET according to a third modification of the first embodiment, and a graph illustrating the profile of the amount of impurities in the pillar layer, where the vertical axis represents the vertical position in the pillar layer, and the horizontal axis represents the pillar impurity amount.

As shown in FIG. 6, in this modification, the profile of the amount of impurities in the pillar layer is corrugated. More specifically, the impurity amount profile of the pillar layer is shaped like a triangle macroscopically, being maximized at the vertical center of the pillar layer, decreasing toward the upper and lower end, and being minimized at the upper and lower end. However, it is corrugated microscopically, alternately including a peak where the amount of impurities is maximized (maximal peak) and a peak where the amount of impurities is minimized (minimal peak). Furthermore, two or more maximal peaks are formed in each of the upper portion of the pillar layer, i.e., the portion from the vertical center to the upper end, and the lower portion, i.e., the portion from the vertical center to the lower end. Of the two or more maximal peaks located in the upper portion, the value (amount of impurities) of the maximal peak relatively nearer to the source electrode 9 is smaller than the value of the maximal peak relatively nearer to the vertical center. Of the two or more maximal peaks in the lower portion, the value of the maximal peak relatively nearer to the drain electrode 1 is smaller than the value of the maximal peak relatively nearer to the vertical center. Such a structure can also achieve an effect similar to that of the above first embodiment.

The microscopically corrugated profile as shown in FIG. 6 can be realized by the method of repeating ion implantation and buried crystal growth or the method of repeating ion implantation with varied acceleration voltages. The macroscopically triangular profile can be realized by varying the dose amount for each iteration of ion implantation. By combining these methods, the SJ structure having the profile of the amount of impurities shown in FIG. 6 can be fabricated.

By forming either or both of the n-pillar layer 3 and the p-pillar layer 4 using ion implantation, the profile of the total amount of impurities is corrugated as shown in FIG. 6. If the amount of impurities in one of the n-pillar layer 3 and the p-pillar layer 4 is controlled by the dose amount during ion implantation, and the other amount of impurities is controlled by the impurity dose amount during crystal growth, then the profile of the one amount of impurities is corrugated, and the profile of the other amount of impurities is stepped as shown in FIG. 5. Also in this case, an effect similar to the foregoing can be achieved if the value of the maximal peak is small on the source electrode 9 side and large on the center side.

In the structure shown in the first embodiment and its modifications described above, the p-pillar layer 4 is not in contact with the $n^+$-drain layer 2. However, it may be in contact therewith. Furthermore, in order to maintain high breakdown voltage, even if the effect of process variation is prevented, it is preferable that the amount of impurities in the n-pillar layer 3 and the amount of impurities in the p-pillar layer 4 be generally equal, and the difference therebetween is preferably 20% or less.

Second Embodiment

Figure 7:
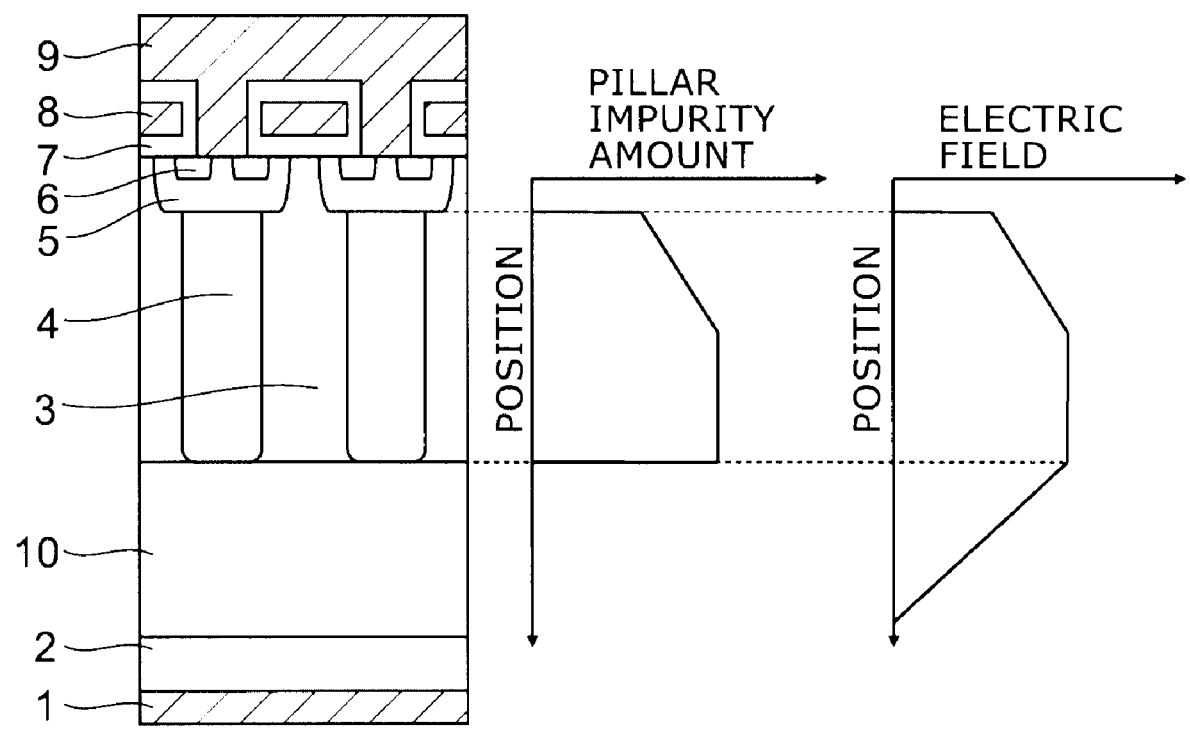
FIG. 7 shows a cross-sectional view schematically illustrating a power MOSFET according to a second embodiment of the invention, a graph illustrating the profile of the amount of impurities in the pillar layer where the vertical axis represents the vertical position in the pillar layer and the horizontal axis represents the pillar impurity amount, and a graph illustrating the profile of electric field where the vertical axis represents the vertical position in the device and the horizontal axis represents electric field.

FIG. 7 shows a cross-sectional view schematically illustrating a power MOSFET according to a second embodiment of the invention, a graph illustrating the profile of the amount of impurities in the pillar layer where the vertical axis represents the vertical position in the pillar layer and the horizontal axis represents the pillar impurity amount, and a graph illustrating the profile of electric field where the vertical axis represents the vertical position in the device and the horizontal axis represents electric field.

As shown in FIG. 7, the power MOSFET according to this embodiment includes an $n^-$-buffer layer 10 interposed between the $n^+$-drain layer 2 and the super junction structure made of n-pillar layers 3 and p-pillar layers 4. The conductivity type of the $n^-$-buffer layer 10 is n-type, and the impurity concentration therein is lower than the impurity concentration in the $n^+$-drain layer 2, and illustratively lower than the impurity concentration in the n-pillar layer 3. The sum of the amounts of impurities in the n-pillar layer 3 and the p-pillar layer 4 decreases toward the source electrode 9 in the upper portion of the pillar layer, but uniform in the lower portion. The configuration of this embodiment other than the foregoing is the same as that of the above first embodiment.

Next, the operation and effect of this embodiment are described.

In this embodiment, upon application of voltage between the drain electrode 1 and the source electrode 9, the $n^-$-buffer layer 10 is depleted. Thus the electric field in the $n^-$-buffer layer 10 is sloped in accordance with the impurity concentration (donor concentration) in the $n^-$-buffer layer 10, decreasing on the drain side. Hence, if the pillar layer in the SJ structure has an impurity amount profile decreasing only in the source side as shown in FIG. 7 to decrease the electric field only in the source side, the overall electric field in the entirety of the SJ structure and the $n^-$-buffer layer 10 has a profile being high at the vertical center and low at the upper and lower end. Consequently, like the above first embodiment, a stable breakdown voltage and a high avalanche withstand capability can be achieved.

Furthermore, the $n^-$-buffer layer 10 serves to prevent variation in the breakdown voltage and the on-resistance of the entire device despite variation in the SJ structure due to process variation. This improves the device stability. Moreover, the $n^-$-buffer layer 10 allows the SJ structure to be thinned, facilitating device fabrication. It is noted that, in this embodiment, the impurity concentration in the $n^-$-buffer layer 10 is preferably lower than the impurity concentration in the n-pillar layer 3 because the distribution of electric field decreasing on the drain side is obtained by depleting the $n^-$-buffer layer 10. The operation and effect of this embodiment other than the foregoing are the same as those of the above first embodiment.

First Modification of the Second Embodiment

Figure 8:
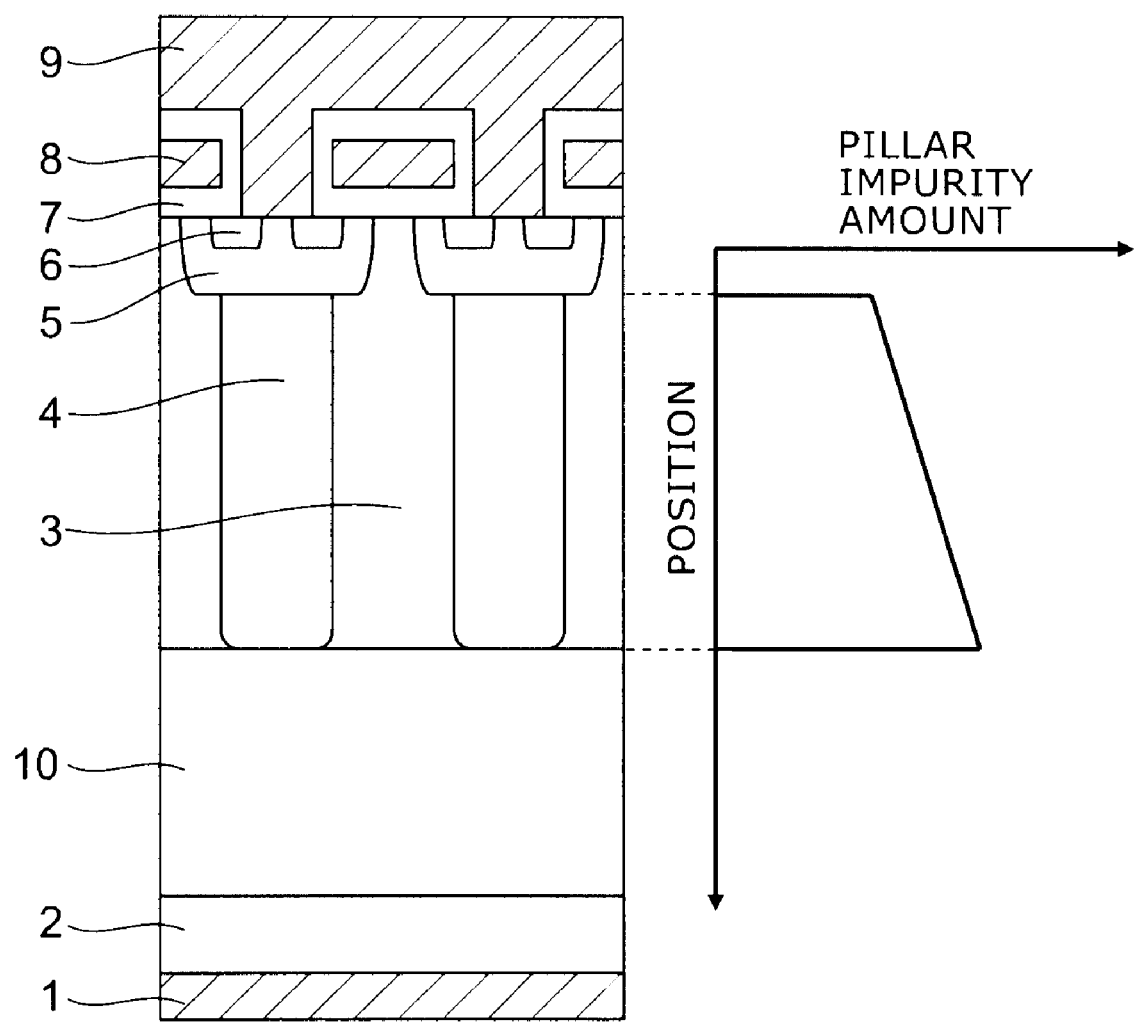
FIG. 8 shows a cross-sectional view schematically illustrating a power MOSFET according to a first modification of the second embodiment, and a graph illustrating the profile of the amount of impurities in the pillar layer, where the vertical axis represents the vertical position in the pillar layer, and the horizontal axis represents the pillar impurity amount.

FIG. 8 shows a cross-sectional view schematically illustrating a power MOSFET according to a first modification of the second embodiment, and a graph illustrating the profile of the amount of impurities in the pillar layer, where the vertical axis represents the vertical position in the pillar layer, and the horizontal axis represents the pillar impurity amount.

As shown in FIG. 8, in this modification, the profile of the amount of impurities in the pillar layer monotonically decreases throughout the vertical direction from the drain electrode 1 toward the source electrode 9. This can also achieve an effect similar to that of the above second embodiment.

Second Modification of the Second Embodiment

Figure 9:
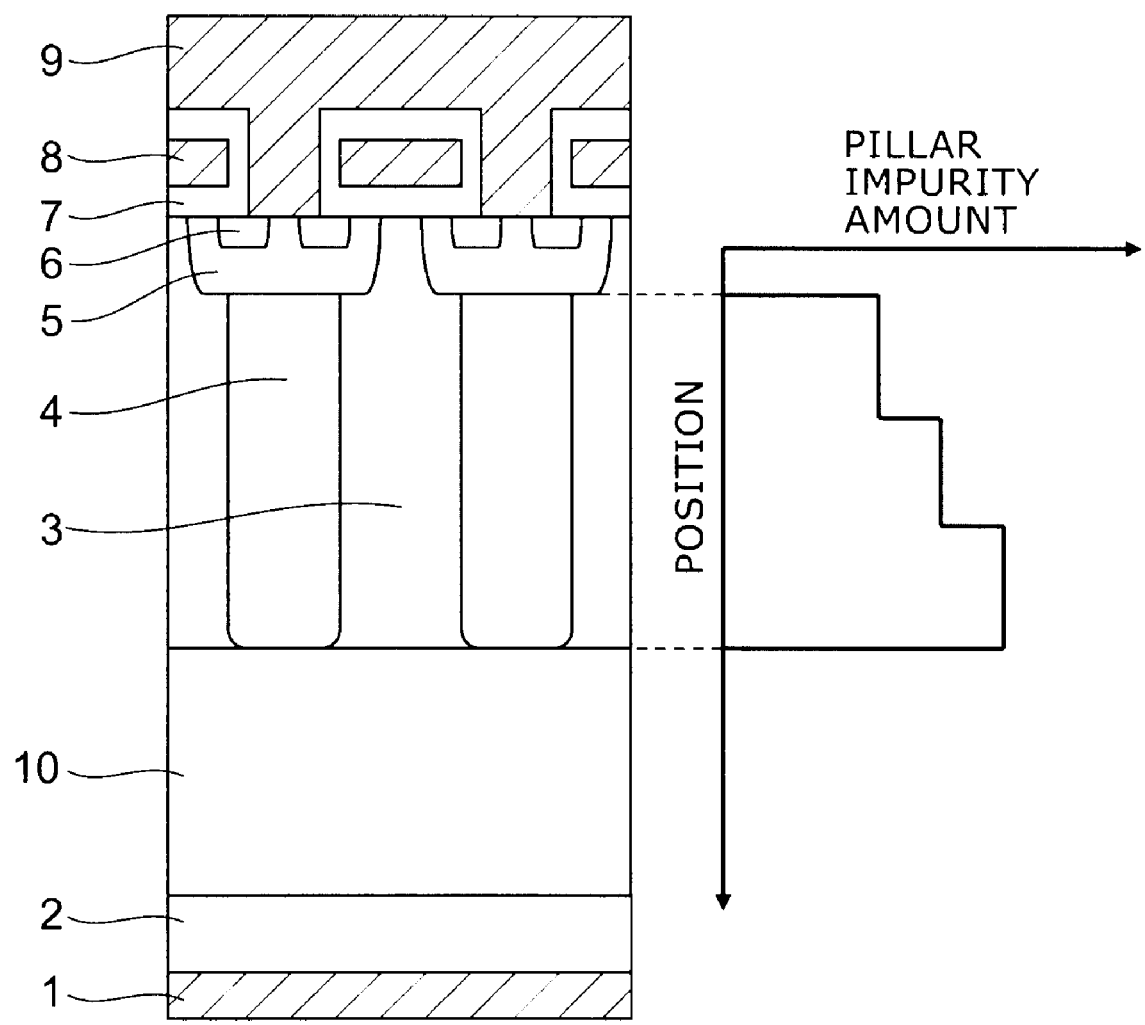
FIG. 9 shows a cross-sectional view schematically illustrating a power MOSFET according to a second modification of the second embodiment, and a graph illustrating the profile of the amount of impurities in the pillar layer, where the vertical axis represents the vertical position in the pillar layer, and the horizontal axis represents the pillar impurity amount.

FIG. 9 shows a cross-sectional view schematically illustrating a power MOSFET according to a second modification of the second embodiment, and a graph illustrating the profile of the amount of impurities in the pillar layer, where the vertical axis represents the vertical position in the pillar layer, and the horizontal axis represents the pillar impurity amount.

As shown in FIG. 9, in this modification, the profile of the amount of impurities in the pillar layer is a stepped profile discontinuously decreasing from the drain electrode 1 toward the source electrode 9. This can also achieve an effect similar to that of the above second embodiment.

Third Modification of the Second Embodiment

Figure 10:
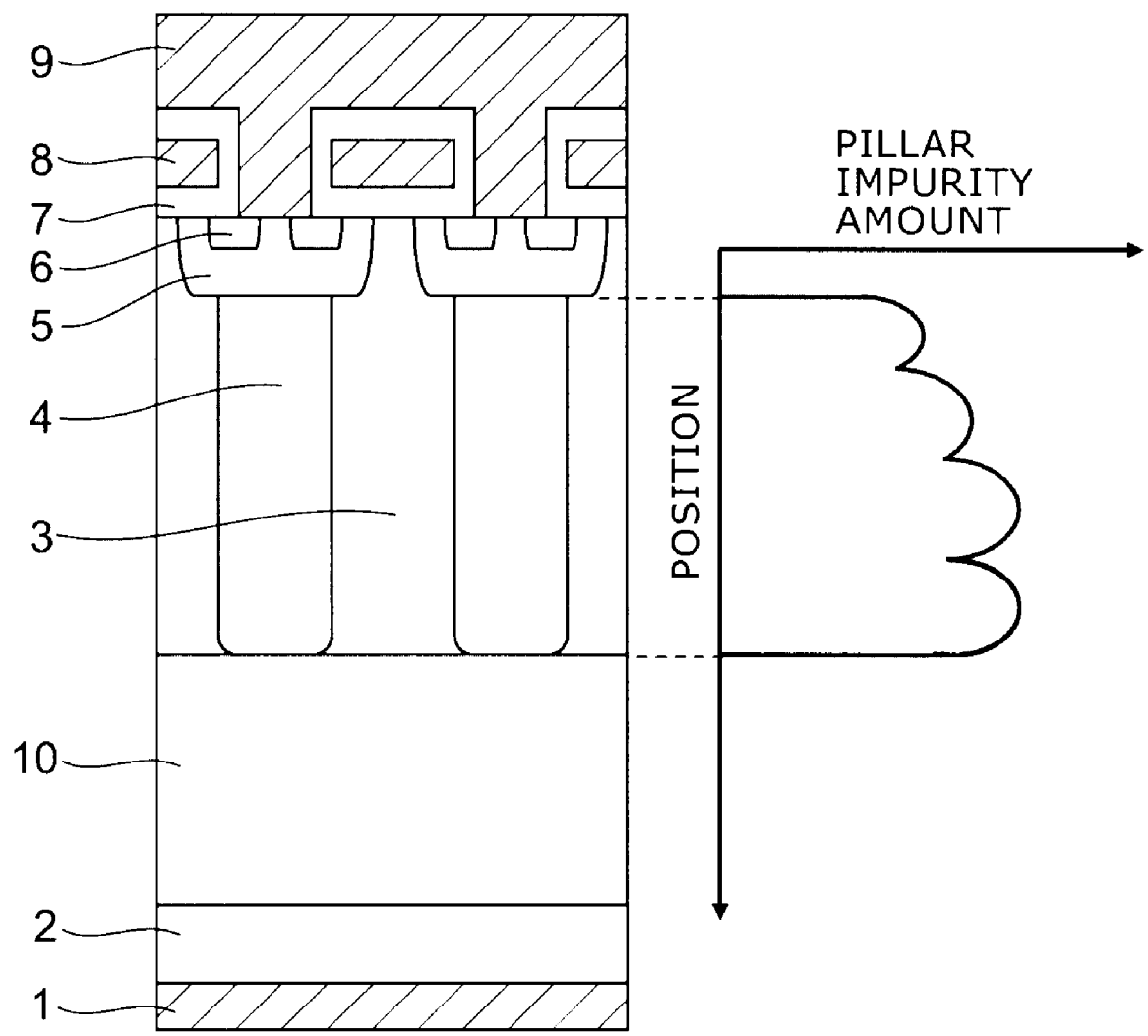
FIG. 10 shows a cross-sectional view schematically illustrating a power MOSFET according to a third modification of the second embodiment, and a graph illustrating the profile of the amount of impurities in the pillar layer, where the vertical axis represents the vertical position in the pillar layer, and the horizontal axis represents the pillar impurity amount.

FIG. 10 shows a cross-sectional view schematically illustrating a power MOSFET according to a third modification of the second embodiment, and a graph illustrating the profile of the amount of impurities in the pillar layer, where the vertical axis represents the vertical position in the pillar layer, and the horizontal axis represents the pillar impurity amount.

As shown in FIG. 10, in this modification, the impurity amount profile of the pillar layer is corrugated microscopically, while monotonically decreasing from the drain electrode 1 toward the source electrode 9 from a macroscopic viewpoint. This can also achieve an effect similar to that of the above second embodiment.

Third Embodiment

Figure 11:
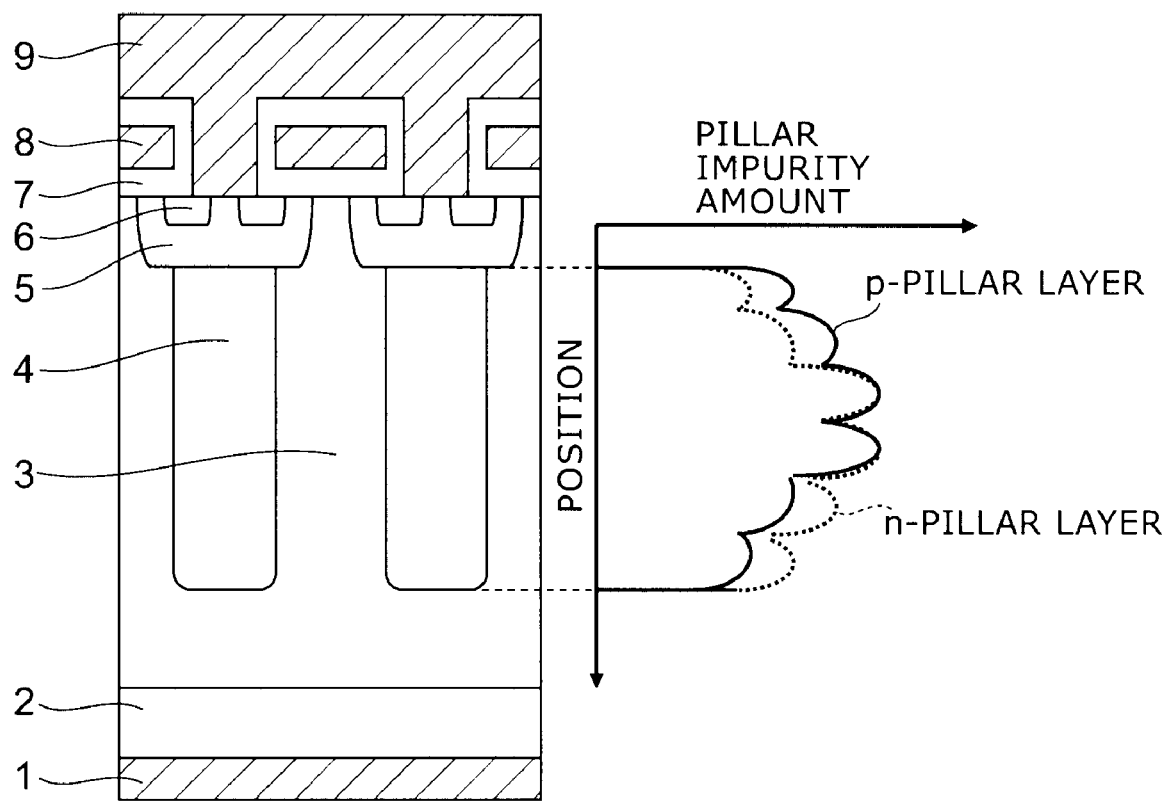
FIG. 11 shows a cross-sectional view schematically illustrating a power MOSFET according to a third embodiment of the invention, and a graph illustrating the profile of the amount of impurities in the pillar layer, where the vertical axis represents the vertical position in the pillar layer, and the horizontal axis represents the pillar impurity amount.

FIG. 11 shows a cross-sectional view schematically illustrating a power MOSFET according to a third embodiment of the invention, and a graph illustrating the profile of the amount of impurities in the pillar layer, where the vertical axis represents the vertical position in the pillar layer, and the horizontal axis represents the pillar impurity amount.

In the graph of FIG. 11, the amount of impurities in the p-pillar layer is represented by a solid line, and the amount of impurities in the n-pillar layer is represented by a dashed line. This also applies to FIGS. 12 and 13 described below.

As shown in FIG. 11, in this embodiment, the impurity amount profile of the n-pillar layer 3 is not in agreement with the impurity amount profile of the p-pillar layer 4. More specifically, the amount of impurities in the p-pillar layer 4 is larger than the amount of impurities in the n-pillar layer 3 on the source electrode 9 side, whereas the amount of impurities in the p-pillar layer 4 is smaller than the amount of impurities in the n-pillar layer 3 on the drain electrode 1 side. The configuration of this embodiment other than the foregoing is the same as that of the above first embodiment.

In this embodiment, the effect described in the above first embodiment, that is, the effect of weakening the horizontal electric field at the upper and lower end by decreasing the amount of impurities at the upper and lower end of the pillar layer, is combined with the effect described in the comparative examples, that is, the effect of weakening the vertical electric field by breaking the balance between the amount of impurities in the n-pillar layer 3 and the amount of impurities in the p-pillar layer 4. Thus the electric field distribution in the SJ structure can be controlled more effectively. This allows the electric field distribution to be varied more greatly by a small variation in the amount of impurities, and the on-resistance can be made lower than that in the structures of the above first and second embodiment and the modifications thereof, and the structure of the comparative examples.

First Modification of the Third Embodiment

Figure 12:
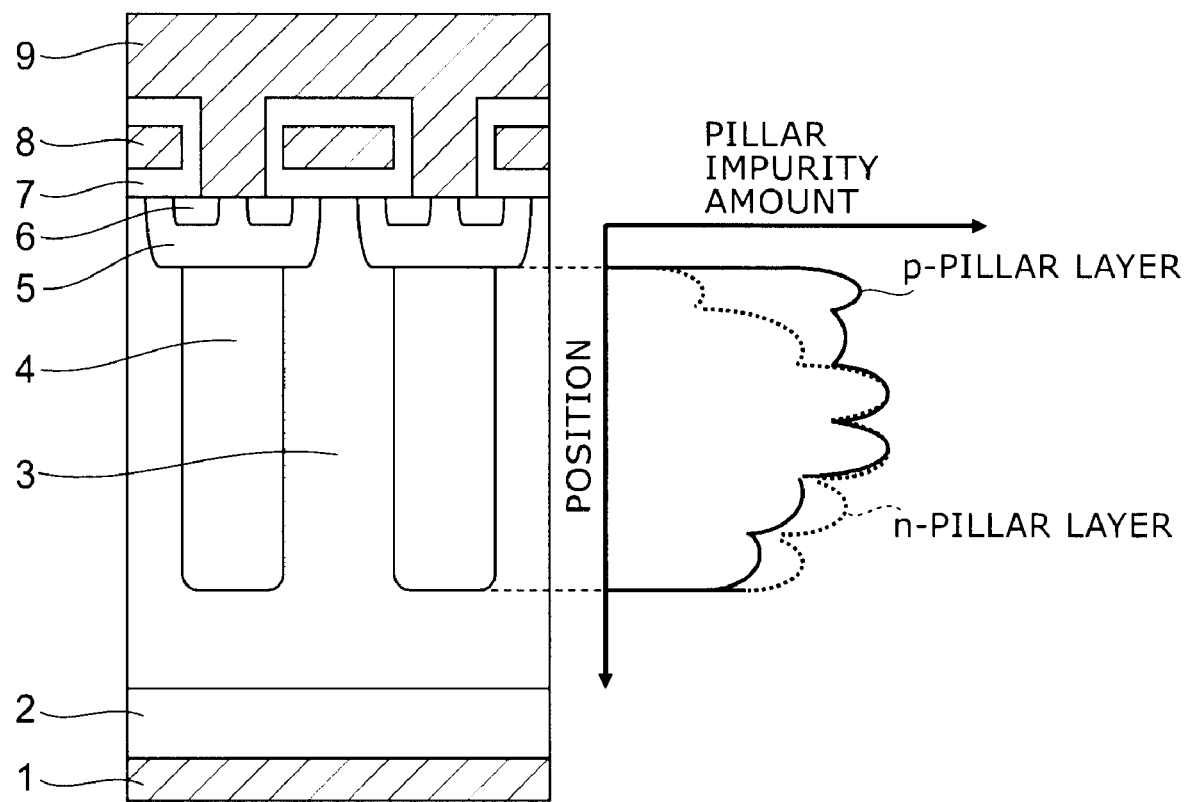
FIG. 12 shows a cross-sectional view schematically illustrating a power MOSFET according to a first modification of the third embodiment, and a graph illustrating the profile of the amount of impurities in the pillar layer, where the vertical axis represents the vertical position in the pillar layer, and the horizontal axis represents the pillar impurity amount.

FIG. 12 shows a cross-sectional view schematically illustrating a power MOSFET according to a first modification of the third embodiment, and a graph illustrating the profile of the amount of impurities in the pillar layer, where the vertical axis represents the vertical position in the pillar layer, and the horizontal axis represents the pillar impurity amount.

As shown in FIG. 12, in this modification, the amount of impurities is locally increased at the upper end of the p-pillar layer 4. However, the amount of impurities is locally decreased at the upper end of the n-pillar layer 3. This cancels out the local increase at the upper end of the p-pillar layer 4, and the sum of the amounts of impurities decreases at the upper end of the pillar layer. That is, in the profile of the sum of the amounts of impurities, the value of the maximal peak nearest to the source electrode 9 is smaller than the value of the maximal peak nearer to the vertical center. Thus the effect of weakening the vertical electric field by breaking the balance of the amount of impurities can be enhanced while maintaining the effect of weakening the horizontal electric field by decreasing the amount of impurities at the upper and lower end of the pillar layer. The configuration, operation, and effect of this modification other than the foregoing are the same as those of the above third embodiment.

Second Modification of the Third Embodiment

Figure 13:
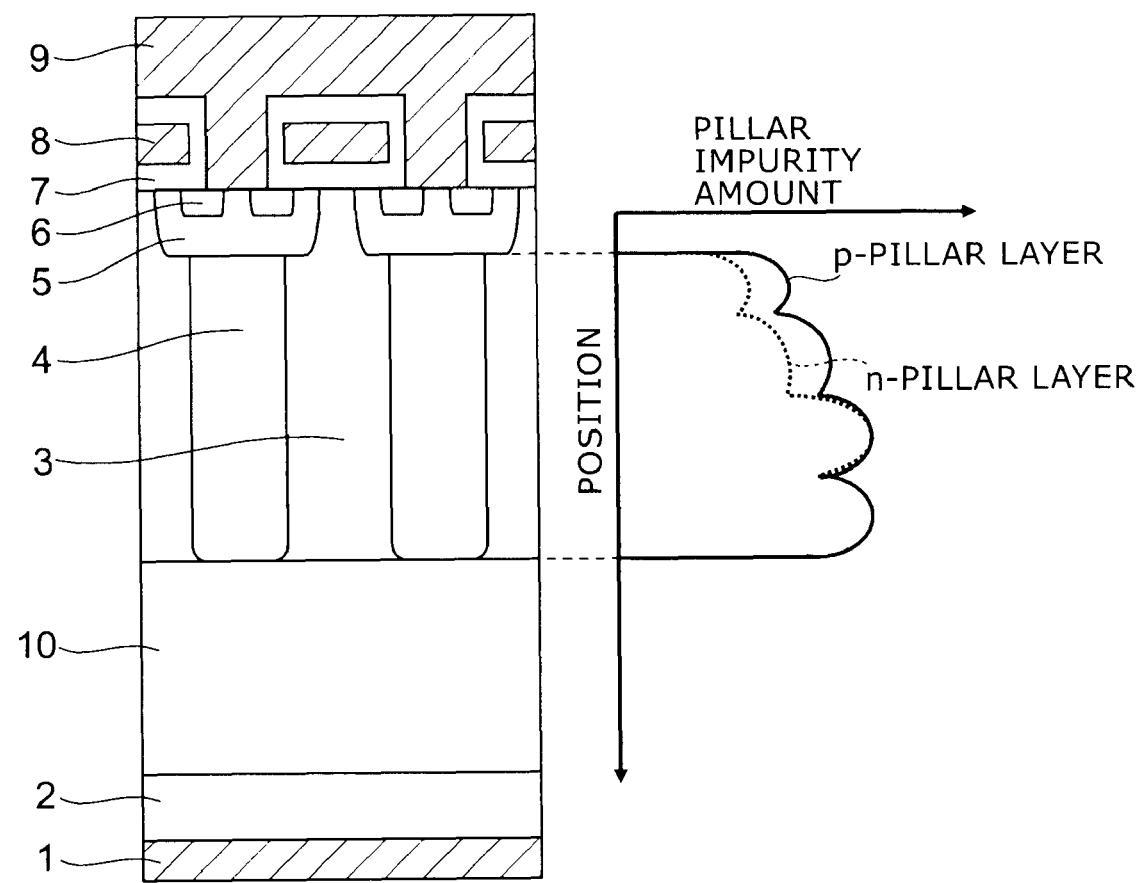
FIG. 13 shows a cross-sectional view schematically illustrating a power MOSFET according to a second modification of the third embodiment, and a graph illustrating the profile of the amount of impurities in the pillar layer, where the vertical axis represents the vertical position in the pillar layer, and the horizontal axis represents the pillar impurity amount.

FIG. 13 shows a cross-sectional view schematically illustrating a power MOSFET according to a second modification of the third embodiment, and a graph illustrating the profile of the amount of impurities in the pillar layer, where the vertical axis represents the vertical position in the pillar layer, and the horizontal axis represents the pillar impurity amount.

As shown in FIG. 13, this modification is a combination of the second embodiment and the third embodiment described above. More specifically, in this modification, an n$^-$-buffer layer 10 is interposed between the SJ structure and the n$^+$-drain layer 2, and the amount of impurities in the p-pillar layer 4 is larger than the amount of impurities in the n-pillar layer 3 on the source electrode side. However, the sum of the amounts of impurities is decreased toward the source side to obtain a large variation in electric field by a small variation in the amount of impurities. The configuration, operation, and effect of this modification other than the foregoing are the same as those of the above second and third embodiment. It is noted that in the third embodiment and its first and second modification, corrugation in the impurity amount profile may be limited to one of the n-pillar layer 3 and the p-pillar layer 4.

The invention has been described with reference to the first to third embodiment and the modifications thereof. However, the invention is not limited thereto. For example, those skilled in the art can suitably vary the above embodiments or the modifications thereof by addition, deletion, and/or design change of components, and such variations are also encompassed within the scope of the invention as long as they include the features of the invention.

For example, in the above embodiments and modifications, it is assumed that the first conductivity type and the second conductivity type are n-type and p-type, respectively. However, the invention is practicable also in the case where the first conductivity type and the second conductivity type are p-type and n-type, respectively.

The method of forming the super junction structure is also not limited to the foregoing. It can be formed by various methods such as the method of performing a plurality of iterations of ion implantation and epitaxial growth, the method of forming a trench followed by buried growth of pillar layers, the method of forming a trench followed by ion implantation into the sidewall, and the method of performing a plurality of iterations of ion implantation with varied acceleration voltages.

While the above embodiments and modifications are illustrated with reference to a device having a planar MOS gate structure, the power semiconductor device according to the invention is also practicable in a trench MOS gate structure.

The pillar planar pattern of the super junction structure is not limited to the foregoing examples. Besides a striped pattern, the invention is practicable in various patterns such as a mesh or offset mesh pattern.

The above embodiments and modifications are described with regard to only the structure of the cell section. However, the termination structure of the device is not particularly limited.

The invention is practicable in various termination structures such as a guard ring structure, a field plate structure, or a RESURF structure.

The above embodiments and modifications are described with reference to MOSFETs using silicon (Si) as the semiconductor. However, compound semiconductors such as silicon carbide (SiC) or gallium nitride (GaN), or wide bandgap semiconductors such as diamond can be also used as the semiconductor.

The above embodiments and modifications are described in the case where the power semiconductor device is a MOSFET having a super junction structure. However, the invention is not limited thereto. The power semiconductor device may be, for example, a hybrid device of a MOSFET and an SBD (Schottky barrier diode), or an IGBT (insulated gate bipolar transistor).

The invention claimed is:

1. A power semiconductor device comprising:
   a first semiconductor layer of a first conductivity type;
   a second semiconductor layer of the first conductivity type and a third semiconductor layer of a second conductivity type provided in an upper portion of the first semiconductor layer, the second and third semiconductor layers being alternately arranged on at least a portion of an upper surface of the first semiconductor layer;
   a plurality of fourth semiconductor layers of the second conductivity type provided on the third semiconductor layer and connected to the third semiconductor layer;
   a fifth semiconductor layer of the first conductivity type selectively formed in an upper surface of each of the fourth semiconductor layers;

a control electrode provided in a region including a directly overlying region of a portion of the fourth semiconductor layers located between the second semiconductor layer and the fifth semiconductor layer;

a gate insulating film insulating the control electrode from the second semiconductor layer, the fourth semiconductor layers, and the fifth semiconductor layer;

a first main electrode provided on a lower surface of the first semiconductor layer and electrically connected to the first semiconductor layer; and a second main electrode provided on the fourth semiconductor layers and the fifth semiconductor layer and connected to the fourth semiconductor layers and the fifth semiconductor layer, a sum of impurities in the second and third semiconductor layers is smaller near a second main electrode side than at a vertical center, in a direction from the second main electrode to the first main electrode, thereby an electric field in the second and third semiconductor layers is lower near the second main electrode side than at the vertical center, the amount of impurities in the second semiconductor layer near the second main electrode being smaller than the amount of impurities in the second semiconductor layer at the vertical center of the second semiconductor layer, and the amount of impurities in the third semiconductor layer near the second main electrode being smaller than the amount of impurities in the third semiconductor layer at the vertical center of the third semiconductor layer.

2. The power semiconductor device according to claim 1, wherein the sum is uniform from the vertical center to a first main electrode side of the second semiconductor layer and the third semiconductor layer.

3. The power semiconductor device according to claim 1, further comprising: a sixth semiconductor layer of the first conductivity type provided between the first semiconductor layer and the second and third semiconductor layers and having a lower impurity concentration than that of the second semiconductor layer.

4. The power semiconductor device according to claim 1, wherein the sum monotonically decreases from a first main electrode side of the second semiconductor layer and the third semiconductor layer toward the second main electrode side.

5. The power semiconductor device according to claim 4, further comprising: a sixth semiconductor layer of the first conductivity type provided between the first semiconductor layer and the second and third semiconductor layers and having a lower impurity concentration than that of the second semiconductor layer.

6. The power semiconductor device according to claim 1, wherein a profile of the sum from the first main electrode toward the second main electrode is a stepped profile discontinuously decreasing from a first main electrode side of the second semiconductor layer and the third semiconductor layer toward the second main electrode side.

7. The power semiconductor device according to claim 6, further comprising: a sixth semiconductor layer of the first conductivity type provided between the first semiconductor layer and the second and third semiconductor layers and having a lower impurity concentration than that of the second semiconductor layer.

8. The power semiconductor device according to claim 1, wherein in at least one of the second semiconductor layer and the third semiconductor layer, the profile of the amount of impurities along the direction from the first main electrode to the second main electrode is provided with corrugation having maximal peaks, and the value of the maximal peak relatively nearer to the second main electrode is smaller than the value of the maximal peak relatively nearer to the first main electrode.

9. The power semiconductor device according to claim 8, further comprising: a sixth semiconductor layer of the first conductivity type provided between the first semiconductor layer and the second and third semiconductor layers and having a lower impurity concentration than that of the second semiconductor layer.

10. The power semiconductor device according to claim 8, wherein the amount of impurities of the third semiconductor layer is greater than the amount of impurities of the second semiconductor layer near the second main electrode side, and the amount of impurities of the third semiconductor layer is smaller than the amount of impurities of the second semiconductor layer near a first main electrode side.

11. The power semiconductor device according to claim 1, wherein the amount of impurities of the third semiconductor layer is equal to the amount of impurities of the second semiconductor layer, and a distribution of the amount of impurities of the third semiconductor layer is equal to a distribution of the amount of impurities of the second semiconductor layer.

12. The power semiconductor device according to claim 1, wherein the amount of impurities in the third semiconductor layer is larger than the amount of impurities in the second semiconductor layer near the second main electrode side.

13. The power semiconductor device according to claim 1, wherein the sum near a first main electrode side of the second semiconductor layer and the third semiconductor layer is smaller than the sum at the vertical center.

14. The power semiconductor device according to claim 13, wherein the amount of impurities of the third semiconductor layer is equal to the amount of impurities of the second semiconductor layer, and a distribution of the amount of impurities of the third semiconductor layer is equal to a distribution of the amount of impurities of the second semiconductor layer.

15. The power semiconductor device according to claim 13, wherein the amount of impurities in the third semiconductor layer is larger than the amount of impurities in the second semiconductor layer near the second main electrode side.

16. The power semiconductor device according to claim 1, wherein the sum monotonically decreases from the vertical center of the second semiconductor layer and the third semiconductor layer toward a first main electrode side of the second semiconductor layer and the third semiconductor layer and toward the second main electrode side, respectively.

17. The power semiconductor device according to claim 1, wherein the sum near the second main electrode side of the second semiconductor layer and the third semiconductor layer is smaller than the sum near a first main electrode side, and a maximal peak in a profile of the sum along the direction from the first main electrode to the second main electrode is provided relatively nearer to the first main electrode side than to the vertical center.

18. The power semiconductor device according to claim 8, wherein a profile of the sum from the first main electrode toward the second main electrode is a stepped profile discontinuously decreasing from the vertical center toward the first main electrode side of the second semiconductor layer and the third semiconductor layer and toward the second main electrode side, respectively.

19. The power semiconductor device according to claim 13, wherein in at least one of the second semiconductor layer and the third semiconductor layer, the profile of the amount of impurities along the direction from the first main electrode to the second main electrode is provided with corrugation having maximal peaks, and the value of the maximal peak relatively nearer to the first main electrode and the value of the maximal peak relatively nearer to the second main electrode are smaller than the value of the maximal peak relatively nearer to the vertical center, respectively.

20. The power semiconductor device according to claim 13, wherein the amount of impurities of the third semiconductor layer is greater than the amount of impurities of the second semiconductor layer near the second main electrode side, and the amount of impurities of the third semiconductor layer is smaller than the amount of impurities of the second semiconductor layer near the first main electrode side.

* * * * *